(12) United States Patent
Coffy et al.

(10) Patent No.: US 8,148,258 B2
(45) Date of Patent: Apr. 3, 2012

(54) METHOD FOR FABRICATING ELECTRICAL BONDING PADS ON A WAFER

(75) Inventors: Romain Coffy, Saint Martin le Vinoux (FR); Jacky Seiller, Veurey-Voroize (FR); Gil Provent, Coublevie (FR)

(73) Assignee: STMicroelectronics (Grenoble) SAS, Grenoble (FR)

(*) Notice: Subject to any disclaimer, the term of this patent is extended or adjusted under 35 U.S.C. 154(b) by 0 days.

(21) Appl. No.: 12/673,975

(22) PCT Filed: Jun. 27, 2008

(86) PCT No.: PCT/EP2008/058239
§ 371 (c)(1),
(2), (4) Date: Mar. 25, 2010

(87) PCT Pub. No.: WO2009/027132
PCT Pub. Date: Mar. 5, 2009

(65) Prior Publication Data
US 2011/0151657 A1    Jun. 23, 2011

(30) Foreign Application Priority Data
Aug. 29, 2007 (FR) .................. 07 57254

(51) Int. Cl.
*H01L 21/44* (2006.01)
(52) U.S. Cl. ........ 438/615; 438/610; 438/612; 438/613; 257/779
(58) Field of Classification Search .................. 438/610, 438/612, 613, 615; 257/779
See application file for complete search history.

(56) References Cited

U.S. PATENT DOCUMENTS

| | | | |
|---|---|---|---|
| 6,042,953 A * | 3/2000 | Yamaguchi et al. | 428/652 |
| 6,329,608 B1 | 12/2001 | Rinne et al. | |
| 6,555,296 B2 * | 4/2003 | Jao et al. | 430/312 |
| 6,784,089 B2 * | 8/2004 | Lei et al. | 438/613 |
| 6,930,031 B2 * | 8/2005 | Huang | 438/612 |
| 7,189,646 B2 * | 3/2007 | Huang | 438/671 |
| 7,271,483 B2 * | 9/2007 | Lin et al. | 257/737 |
| 7,459,386 B2 * | 12/2008 | Tseng et al. | 438/613 |
| 2002/0137325 A1 | 9/2002 | Shao | |
| 2002/0146646 A1* | 10/2002 | Jao et al. | 430/312 |
| 2003/0164395 A1 | 9/2003 | Tong et al. | |
| 2008/0258305 A1* | 10/2008 | Lee et al. | 257/758 |

FOREIGN PATENT DOCUMENTS
EP    0 723 387 A1    7/1996

OTHER PUBLICATIONS
International Search Report, International Application No. PCT/EP2008/058239, Aug. 18, 2008.
Preliminary Search Report, FR 0757254, Apr. 10, 2008.

\* cited by examiner

*Primary Examiner* — Jarrett Stark
*Assistant Examiner* — John M Parker
(74) *Attorney, Agent, or Firm* — Gardere Wynne Sewell LLP

(57) ABSTRACT

A method for fabricating electrical bonding pads on the electrical contact areas of a wafer includes producing first blocks made of a solder material, producing second blocks made of a solder material on these first blocks, and passing the blocks through an oven so as to shape the blocks into approximately domed electrical bonding pads.

6 Claims, 3 Drawing Sheets

METHOD FOR FABRICATING ELECTRICAL BONDING PADS ON A WAFER

PRIORITY CLAIM

The present application is a 35 USC 371 filing from PCT/EP2008/058239 filed Jun. 27, 2008 which claims the benefit of French Application for Patent No. 0757254 filed Aug. 29, 2007, the disclosures of which are incorporated by reference.

TECHNICAL FIELD

The present invention relates to the field of semiconductor electronic devices and components, and more particularly to the field of producing the electrical bonding pads of such devices and components.

SUMMARY

According to one embodiment, a method is proposed for fabricating electrical bonding pads on the electrical contact areas of a wafer.

This method comprises the following steps: deposition of a first layer made of a screen material; production of first openings in this first layer over at least some of said electrical contact areas; production of first blocks made of a solder material in said first openings; deposition of a second layer on the first layer and the first blocks; production of second openings in this second layer, placed above at least some of the first blocks, the section of each second opening being smaller than the section of the upper face of the underlying block; production of second blocks made of a solder material in said second openings; removal of the material of the first and second layers; and passage through an oven so as to shape said blocks into approximately domed electrical bonding pads.

According to one exemplary embodiment, the method might possibly comprise a step of producing second openings, the periphery of which is at a distance from and in the interior of the periphery of the corresponding underlying first blocks.

According to another exemplary embodiment, the method might possibly comprise a step of producing a single second opening on the corresponding underlying blocks.

According to another exemplary embodiment, the method might possibly comprise a step of producing at least two second openings on the corresponding underlying blocks.

According to another exemplary embodiment, the method might possibly comprise a step of producing second openings over some of the first blocks and no second opening over other first blocks.

According to another exemplary embodiment, the pads resulting from the first blocks might possibly be approximately circular or in the form of parts of balls, and the pads resulting from the superposed first and second blocks are approximately elongate or in the form of bars.

According to another exemplary embodiment, the quantities of solder material of said blocks might possibly be such that the height of the pads obtained is approximately identical from one pad to another.

According to another exemplary embodiment, the method might possibly comprise a preliminary step of depositing an intermediate conducting layer, and possibly a step of removing this layer around the first pads formed before passing through the oven.

BRIEF DESCRIPTION OF THE DRAWINGS

The present invention will now be illustrated, simply by way of non-limiting examples, through a description of embodiments of electrical bonding pads with reference to the drawings in which.

DETAILED DESCRIPTION OF THE DRAWINGS

Figure 1:
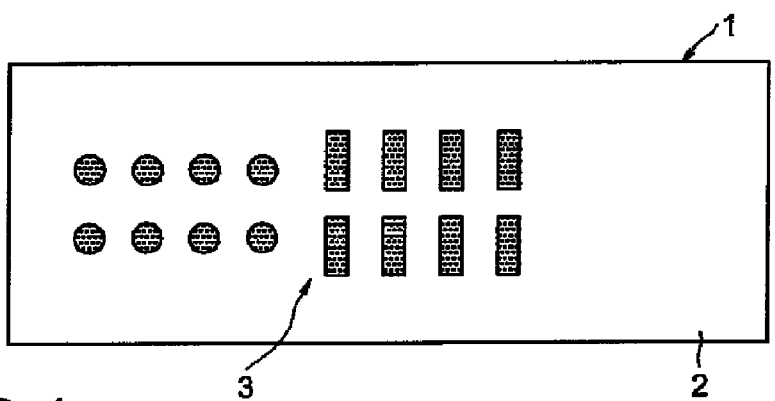
FIG. 1 represents a front view of a wafer provided with electrical contact areas.

FIG. 1 represents a wafer 1 which has, on its front face 2, spaced metallized electrical contact areas 3, intended for the electrical connection of this wafer to one or more electronic components by means of electrical bonding pads that can be produced in the following manner, implementing the means and methods currently used in microelectronics.

Figure 2:
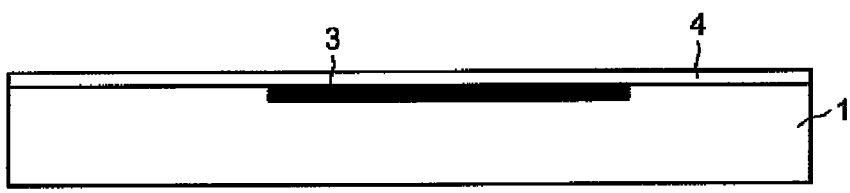
FIGS. 2 to 8 illustrate different, non-limiting, steps in fabricating electrical bonding pads on a wafer represented in cross section.

As FIG. 2 shows, taking a wafer 1, a thin intermediate tie layer 4 made of an electrically-conducting material (UBM) is formed on its front face 2.

Figure 3:
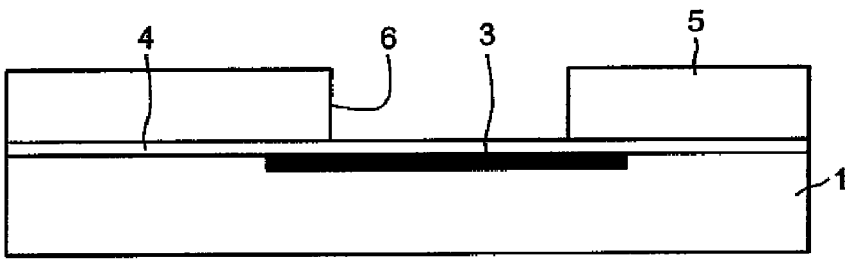

As FIG. 3 shows, a first layer 5 made of a screen material, for example a photosensitive resin called hereafter photoresist, is formed on the intermediate layer 4 and first openings 6 are produced in this first layer over at least some of the electrical contact areas 3.

Figure 4:
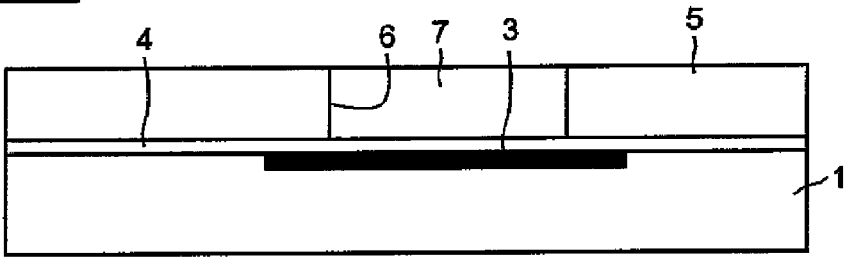

As FIG. 4 shows, first blocks 7, made of an electrically conducting (for example, metallic) solder material that conducts electricity, are produced in the first openings 6. These blocks can be obtained, for example, by electrolytic growth or deposition.

Figure 5:
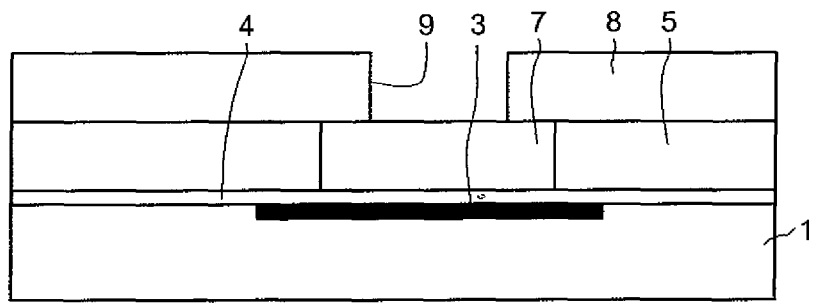

As FIG. 5 shows, a second layer 8 made of a screen material, for example a photoresist, is formed on the first layer and on the first blocks produced 7, and second openings 9 are produced in this second layer above at least some of the first blocks 7 produced.

These second openings 9 are such that their section is smaller than the section of the upper face of the respectively underlying or corresponding first blocks 7 and inscribed in this section.

Figure 6:
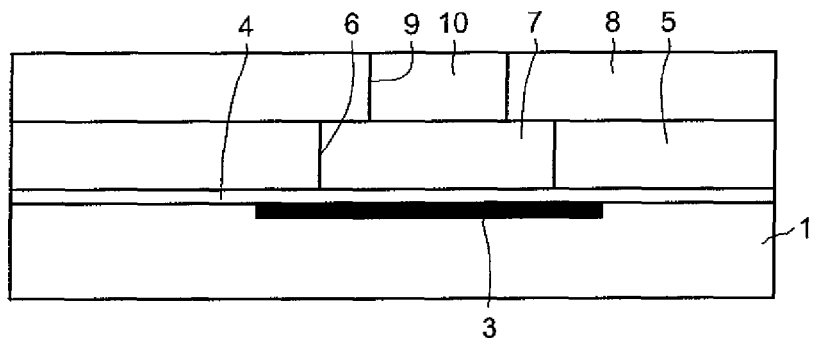

As FIG. 6 shows, second blocks 10 made of an electrically conducting (for example, metallic) solder material that conducts electricity are produced in the second openings 9, these second blocks filling the openings 9 approximately to their edges and forming an additional supply of material. These blocks can be obtained, for example, by electrolytic growth or deposition.

Figure 7:
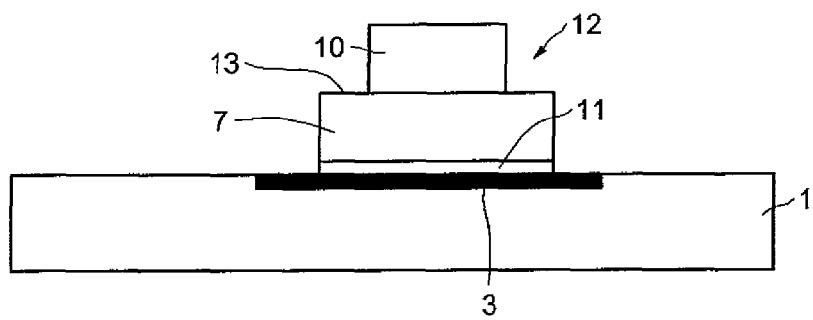

As FIG. 7 shows, the first and second layers 5 and 8 are removed or taken off, and the material of the intermediate layer 4 is removed or taken off, leaving portions 11 of the intermediate layer under the first blocks 7.

What are then obtained are parts 12 standing out on the conductive areas 3 of the wafer 1, which comprise a portion 11 of the intermediate layer 4, a first block 7 on this portion and a second block 10 on this first block, respectively.

According to a variant, the periphery of the second openings 9 is at a distance from and in the interior of the periphery of the respectively corresponding and underlying first blocks 7, in such a way that the first block 7 of each protruding part 12 has a peripheral front shoulder 13 around its second block 10.

Figure 8:
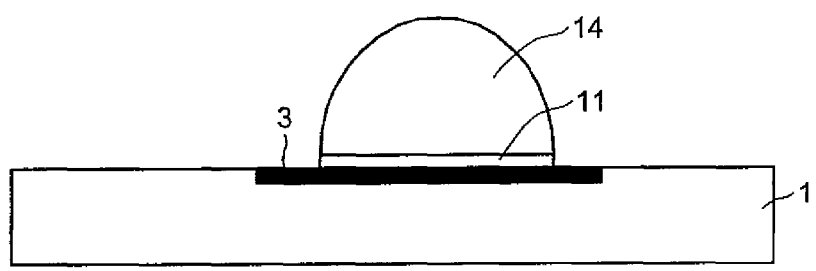

Then, as shown in FIG. 8, the wafer 1 is placed in an oven at a temperature such that, by rapid melting, plastic flow and the effect of surface tension, the superposed blocks 7 and 10 melt into each other and form into approximately domed electrical bonding pads 14.

The material forming the superposed blocks 7 and 10 might possibly, for example, be an alloy of tin, silver and/or copper.

According to one exemplary embodiment, the layers 5 and 8 might have a thickness of between 50 and 150 microns, and be of equal thicknesses or of different thicknesses.

According to one exemplary embodiment, the openings 6 and 9 can be square or circular with the aim of producing solder pads 14 in the form of portions of balls. According to a variant, the side or the diameter of these openings can be between 20 and 150 microns.

According to another exemplary embodiment, the openings 6 and 9 can be elongate with the aim of producing solder pads 14 in the form of bars. In the case where they are to be approximately rectangular, these openings might have a width of between 20 and 150 microns and a length of between 100 and 600 microns.

The profile of the periphery of the second openings 9, and consequently of the second blocks 10, and the profile of the periphery of the first openings 6, and consequently of the first blocks 7, may ensue in a homothetic manner or be different.

The volumes of material of the first blocks 7 and the volumes of additional material of the second blocks 10 can be adapted to the volumes of material, to the sections and to the heights of the electrical bonding pads 14 to be obtained.

For example, in the particular case of a final electrical bonding pad 14 in the form of a bar, the distribution of the material of the first block 7 and the distribution of the material of the second block 10 can be adapted so that this pad 14 has an end area approximately parallel to the front face of the wafer 1.

Figure 9:
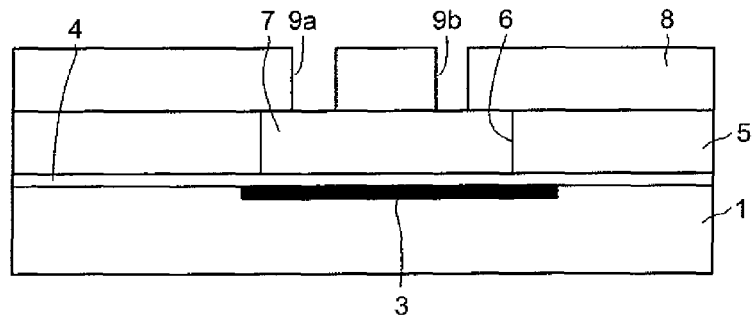
FIG. 9 illustrates one step of another embodiment.

According to a variant represented in FIG. 9, at least two spaced second openings 9a and 9b can be produced in a second layer 8, on top of an underlying first block 7. Following the steps described above, an additional supply of solder material is provided in at least two places above this first block 7.

Figure 10:
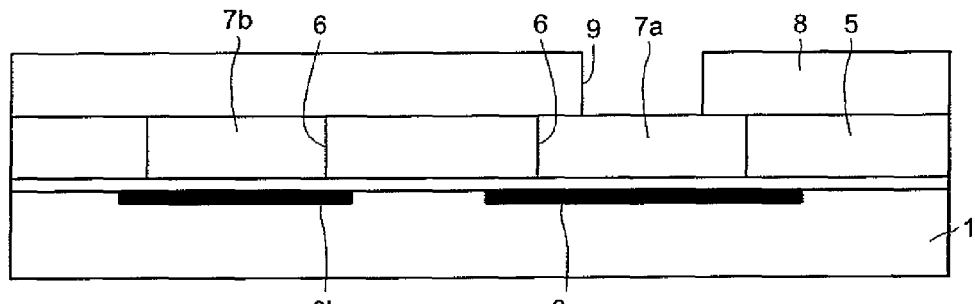
FIGS. 10 to 12 illustrate steps of another embodiment.

According to a variant represented in FIG. 10, second openings 9 can be formed in a second layer 8 only above some of the first pads 7a situated above the electrical contact areas 3a without producing these above some other blocks 7b situated above the electrical contact areas 3b.

Figure 11:
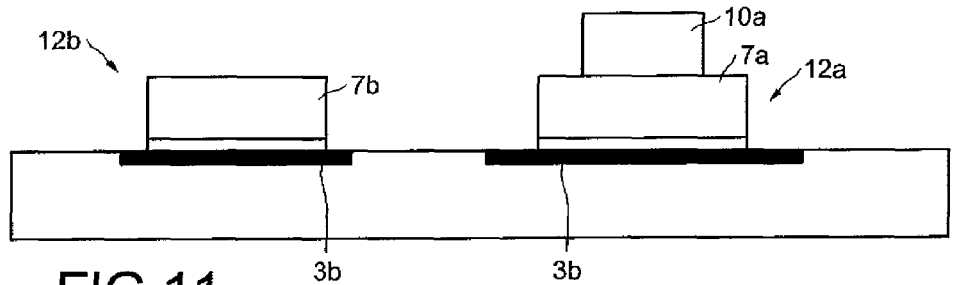
Figure 12:
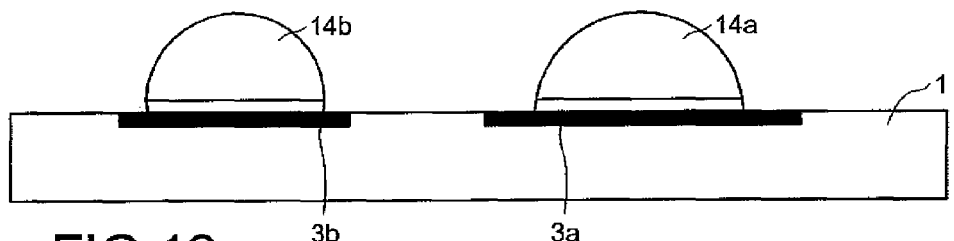

As FIG. 11 shows, following the steps described above, what are obtained are protruding parts 12a, formed from superposed first blocks 7a and second blocks 10a, and protruding parts 12b formed from first blocks 7b alone. Following the steps described above, the corresponding electrical bonding pads 14a and 14b are obtained.

As FIG. 11 shows, the dimensions and the volumes of material of the first blocks 7a and 7b and of the second blocks 10a can, according to a variant of the embodiment, be adapted so that the corresponding electrical bonding pads 14a and 14b obtained have approximately identical heights.

It results from the preceding that, notably, the supply of material due to the production of second blocks superposed on first blocks permits a large degree of adaptability in producing electrical bonding pads, even if the pads have different dimensions on one and the same wafer or are derived from only one first block.

It also results from the preceding that, notably, electrical contact pads adapted to the passage of relatively high current can be obtained.

The invention claimed is:

1. Method for fabricating electrical bonding pads on electrical contact areas of a wafer, comprising:
   depositing a first layer made of a screen material;
   producing first openings in this first layer over at least some of the electrical contact areas;
   producing first blocks made of a solder material in the first openings;
   depositing a second layer made of a screen material on the first layer and the first blocks;
   producing second openings in this second layer, placed above at least some of the first blocks, a section of each second opening being smaller than a section of the upper face of the underlying block;
   producing second blocks made of a solder material in the second openings;
   removing the material of the first and second layers; and
   heating so as to shape each of the combined first and second blocks into a domed electrical bonding pad;
   wherein producing the second opening comprises producing at least two second openings over and in contact with an upper surface of each underlying first block.

2. Method for fabricating electrical bonding pads on electrical contact areas of a wafer, comprising:
   depositing a first layer made of a screen material;
   producing first openings in this first layer over at least some of the electrical contact areas;
   producing first blocks made of a solder material in the first openings;
   depositing a second layer made of a screen material on the first layer and the first blocks;
   producing second openings in this second layer, placed above at least some of the first blocks, a section of each second opening being smaller than a section of the upper face of the underlying block;
   producing second blocks made of a solder material in the second openings;
   removing the material of the first and second layers; and
   heating so as to shape each of the combined first and second blocks into a domed electrical bonding pad;
   wherein producing the second opening comprises producing second openings over each of some first blocks and producing no second opening over other ones of the first blocks.

3. Method according to claim 2, wherein the pads resulting from the first blocks are approximately circular domes, and wherein the pads resulting from the superposed first and second blocks are approximately elongate domes or in the form of bar-shaped domes.

4. Method according to claim 3, wherein a quantity of solder material used in the blocks is such that a height of the pads obtained is approximately identical from one pad to another.

5. Method for fabricating electrical bonding pads on electrical contact areas of a wafer, comprising:
   depositing an intermediate conducting layer;
   then depositing a first layer made of a screen material;
   producing first openings in this first layer over at least some of the electrical contact areas;
   producing first blocks made of a solder material in the first openings;
   depositing a second layer made of a screen material on the first layer and the first blocks;
   producing second openings in this second layer, placed above at least some of the first blocks, a section of each second opening being smaller than a section of the upper face of the underlying block;

producing second blocks made of a solder material in the second openings;
removing the material of the first and second layers;
removing the intermediate conducting layer around the first blocks; and
then heating so as to shape each of the combined first and second blocks into a domed electrical bonding pad.

6. A method for fabricating an electrical bonding pad on an electrical contact area of a wafer, comprising:
depositing a first screen layer;
producing a first opening in this first screen layer over the electrical contact area;
producing a first block made of a solder material in the first opening;
depositing a second screen layer on the first screen layer and the first block;
producing a second and third opening in this second screen layer wherein the second and third openings are not connected but which are both placed directly above and within an outer perimeter of the first block;
producing a second and third block made of a solder material in the second and third openings, respectively;
removing the first and second screen layers; and
heating so as to melt the combined first, second and third blocks into a domed electrical bonding pad.

* * * * *